(12) United States Patent  (10) Patent No.: US 7,847,228 B2
Lin  (45) Date of Patent: Dec. 7, 2010

(54) SOLAR ENERGY COLLECTOR WITH CALCULATION OF THE TRAJECTORY OF THE SUN ACCORDING TO THE MOTION OF A SHADOW OF A PROJECTING POINTER

(75) Inventor: Da-Wei Lin, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 187 days.

(21) Appl. No.: 12/327,602

(22) Filed: Dec. 3, 2008

(65) Prior Publication Data

US 2009/0288656 A1 Nov. 26, 2009

(30) Foreign Application Priority Data

May 20, 2008 (CN) .......................... 2008 1 0301671

(51) Int. Cl.
*G01C 21/02* (2006.01)
(52) U.S. Cl. ..................................... 250/203.4; 250/221
(58) Field of Classification Search ............. 250/203.4, 250/203.6, 203.1, 221; 126/576–578, 591–595; 359/852, 853
See application file for complete search history.

(56) References Cited

U.S. PATENT DOCUMENTS 5,022,736 A * 6/1991 Mori ........................... 385/33

* cited by examiner

*Primary Examiner*—Que T Le
(74) *Attorney, Agent, or Firm*—Clifford O. Chi

(57) ABSTRACT

A solar energy collector includes a parabolic reflector, a solar panel, a photosensor panel, a projecting pointer, a solar location calculator, and a reflector mount. The parabolic reflector includes a parabolic reflecting surface. The solar panel includes a light receiving surface for facing the reflecting surface. The photosensor panel includes a light sensing surface. The projecting pointer is mounted on the photosensor panel. The solar location calculator is connected to the photosensor panel, and is configured for calculating the trajectory of the sun relative to a geographic location of the parabolic reflector according to the motion of a shadow of the projecting pointer on the light sensing surface sensed by the photosensor panel and generating a control signal associated therewith. The reflector mount is configured for supporting and moving the parabolic reflector in following movement of the sun in response to the control signal from the solar location calculator.

14 Claims, 5 Drawing Sheets

SOLAR ENERGY COLLECTOR WITH CALCULATION OF THE TRAJECTORY OF THE SUN ACCORDING TO THE MOTION OF A SHADOW OF A PROJECTING POINTER

BACKGROUND

1. Technical Field

The disclosure relates to a solar energy collector.

2. Description of Related Art

There are a number of ways to collect solar energy, one of which is to track the sun during movement across the sky form sunrise to sunset. This technique obviously results in a greater recovery of solar energy during a given day than a stationary approach wherein the solar panel remains in a fixed position. The system must, however, be programmed differently for different locations on the earth's surface, as well as for different days during the year. Such settings tend to be complicated, uneconomical and unreliable.

What is needed, therefore, is a solar energy collector providing efficient and dependable collection of solar energy.

Figure 1:
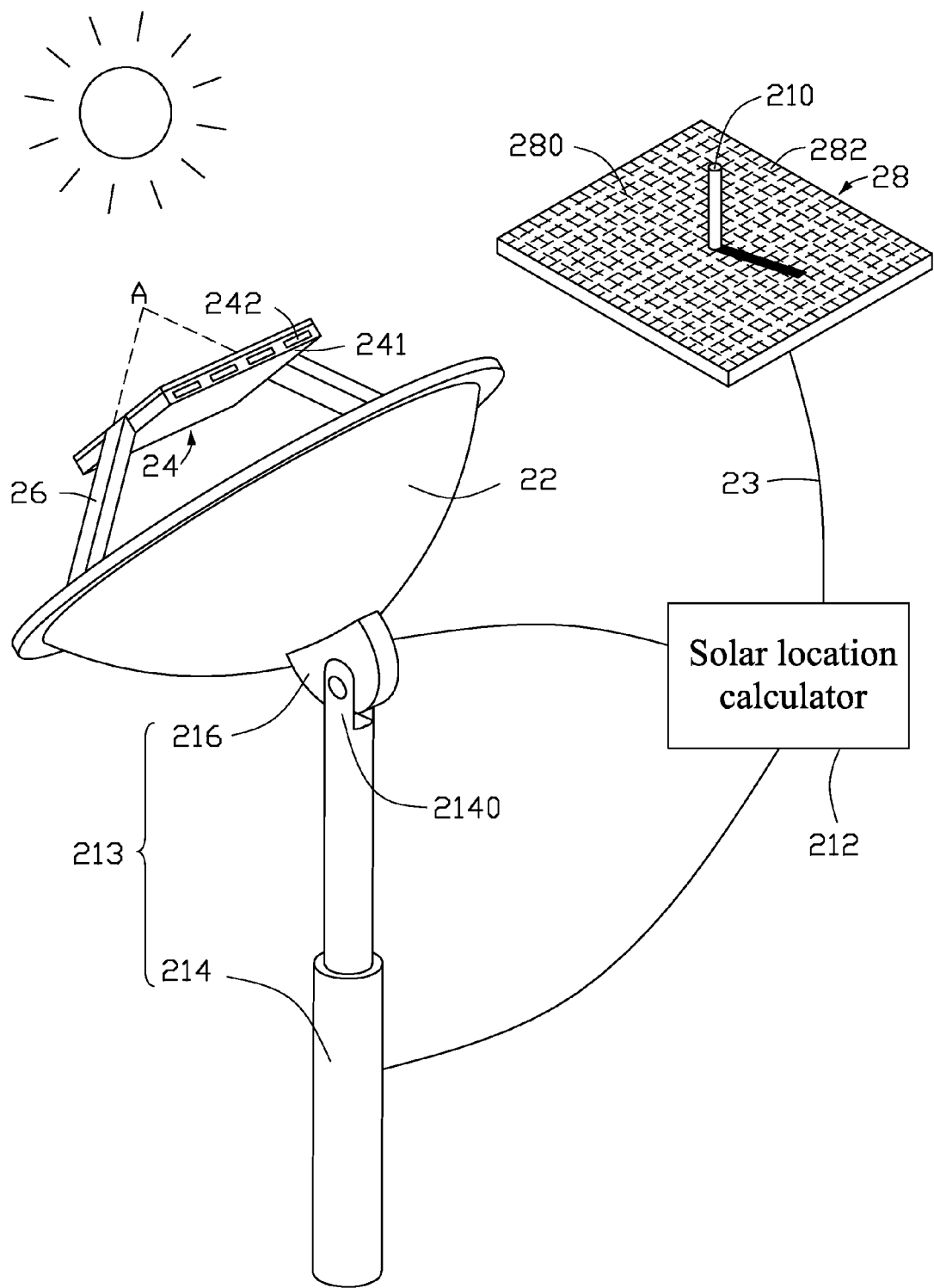
FIG. 1 is a perspective view of a solar energy collector in accordance with the disclosure.

Corresponding reference characters indicate corresponding parts. The exemplifications set out herein illustrate at least one preferred embodiment of the present a solar energy collector, in one form, and such exemplifications are not to be construed as limiting the scope of the disclosure in any manner.

DETAILED DESCRIPTION OF THE DISCLOSURE

Referring to FIGS. 1 to 5, a solar energy collector 2 in accordance with an embodiment of the present disclosure includes a parabolic reflector 22, a solar panel 24, a photosensor panel 28, a projecting pointer 210, a solar location calculator 212 and a reflector mount 213.

The parabolic reflector 22 includes a focus A and a parabolic reflecting surface 221 having a central point O. The parabolic reflector 22 can be made of highly reflective material, with parabolic reflecting surface 221 configured to reflex the solar to the solar panel 24 for improved the collection efficiency.

The solar panel 24 includes an array of photovoltaic solar cells 242 and a light receiving surface 241. The photovoltaic solar cell 242 may be a PN or PIN junction type semiconductor element of Ge, GaAs and GaInP.

The solar panel 24 is positioned in the proximity of the focus point of the parabolic reflector 22 by a retaining device 26. The light receiving surface 241 of the solar panel 24 faces the parabolic reflecting surface 221 of the parabolic reflector 22, perpendicular to a principal axis OA through the focus A of the parabolic reflector 22 and the central point O of the parabolic reflecting surface 221. Distance is generated between the solar panel 24 and the focus A of the parabolic reflector 22, such that solar panel 24 receives reflection from the parabolic reflector 22 in one area.

The photosensor panel 28 includes a light sensing surface 280 having a plurality of sensor zones 282. The projecting pointer 210, mounted on the photosensor panel 28, forms a shadow thereon.

Figure 2:
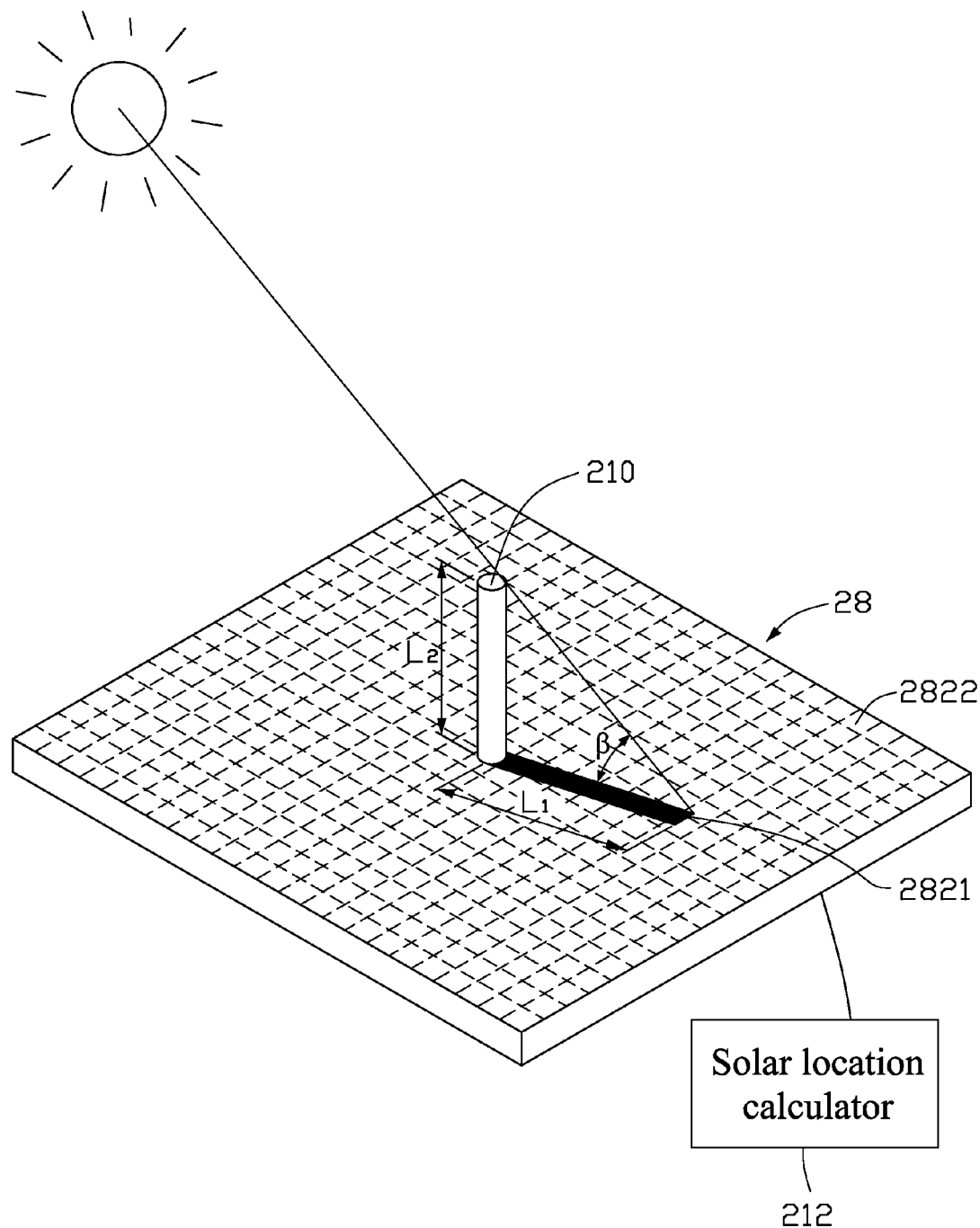
FIG. 2 is a perspective view of a photosensor panel of a solar energy collector in accordance with the disclosure.

The solar location calculator 212 is connected to the photosensor panel 28. The solar location calculator 212 is configured for calculating the trajectory of the sun relative to a geographic location of the parabolic reflector according to the motion of the shadow of the projecting pointer 210 on the light sensing surface 280 sensed by the photosensor panel 28 and generating a control signal associated therewith. The solar location calculator 212 is configured for calculating an azimuth θ and angle β of the sun according to the output of the photosensor panel 28. Referring to FIG. 2, the outputs of sensing zones 2821 and 2822 are different. The solar location calculator 212 calculates length L1 of the shadow according to the output. The formula of the azimuth θ is tan β=L1/L2 and the formula of the height of angle β is β=arctan β, because the length L2 of the projecting pointer 210 is known.

Figure 3:
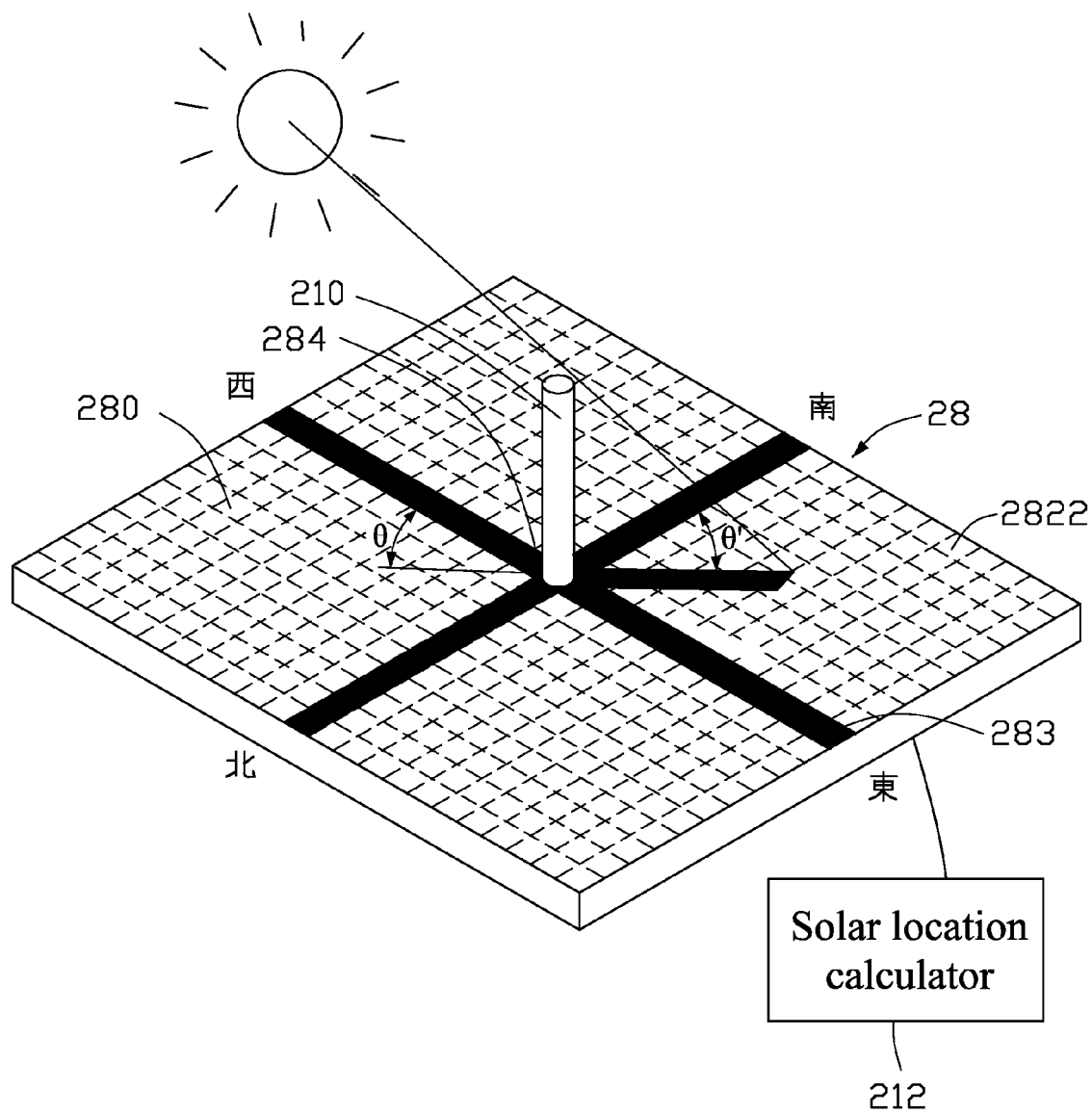
FIG. 3 is a perspective view of a photosensor panel of a solar energy collector in accordance with the disclosure, showing the light sensing surface of the photosensor panel including east, south, west and north reference lines.

Referring to FIG. 3, the photosensor panel 28 includes four reference lines 283 on the light sensing surface 280 for respectively aligning with due east, south, west and north. The solar location calculator 212 calculates the angle θ' between the shadow and the near reference line 283 and the azimuth θ of the sun according to the angle θ', because the direction of the sun and the shadow are symmetrical. For example, if the direction of the shadow is east by north 45°, the direction of the sun is, accordingly, west by south 45°.

Figure 4:
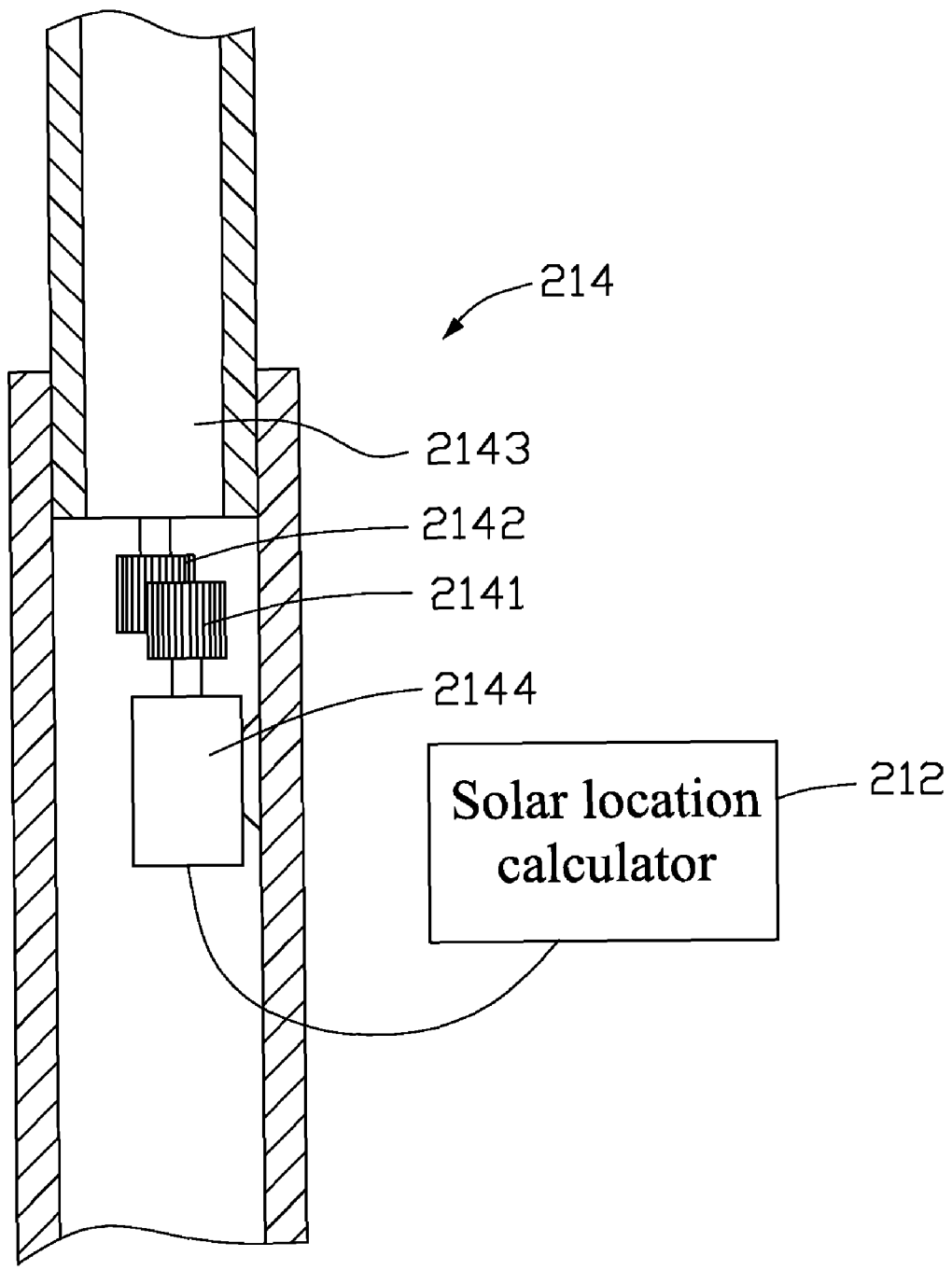
FIG. 4 is a sectional view of an azimuth adjuster of a solar energy collector in accordance with the disclosure.

The reflector mount 213 is configured for supporting and moving the parabolic reflector 22 in following movement of the sun in response to the control signal from the solar location calculator 212. The reflector mount 213 includes an azimuth adjuster 214 and an elevation adjuster 216. The azimuth adjuster 214 is communicatively coupled to the solar location calculator 212. The azimuth adjuster 214 is configured for adjusting an azimuth of the parabolic reflector 22 according to the control signal from the solar location calculator 212. Referring to FIG. 4, the azimuth adjuster 214 includes a rotary rod 2143, a driven gear 2142 coupled to the rotary rod 2143, a driving gear 2141 meshed with the driven gear 2142, and a motor 2144 for driving the driving gear 2141. A top end 2140 of the rotary rod 2143 is coupled to the elevation adjuster 216. The elevation adjuster 216 is coupled to the parabolic reflector 22. The motor 2144 is configured driving the driving gear 2141 and the driven gear 2142 to aim the parabolic reflector 22 at the azimuth of the sun according to the control signal from the solar location calculator 212.

Figure 5:
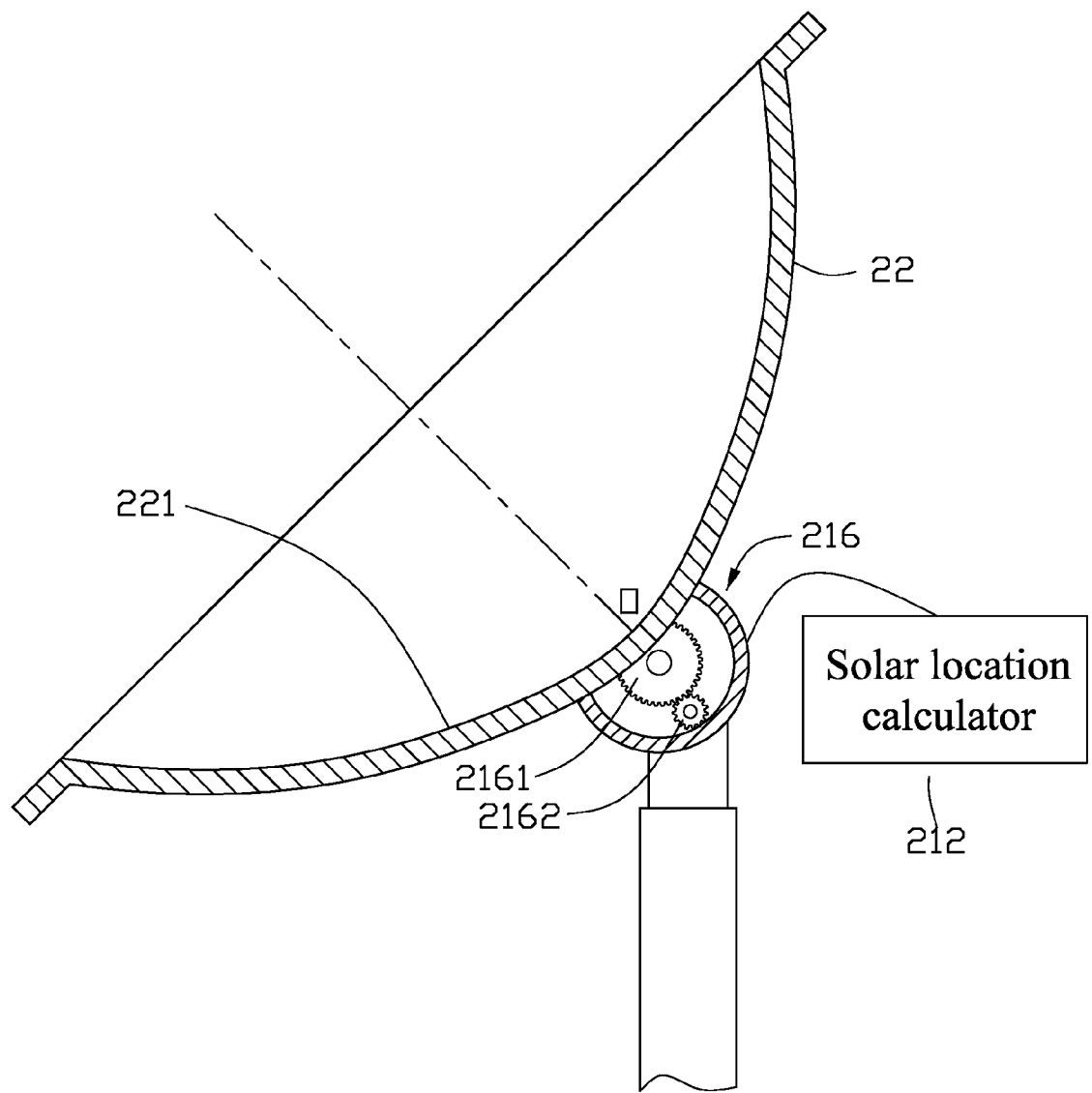
FIG. 5 is a sectional view of a height adjuster of a solar energy collector in accordance with the disclosure.

Referring to FIG. 5, the elevation adjuster 216 includes a power gear 2161, a rotary gear 2162 meshed with the power gear 2161, and a motor for driving the power gear 2161. The rotary gear 2162 is mounted on an opposite side of the parabolic reflector 22 to the solar panel 24. The elevation adjuster 216 is communicatively coupled to the solar location calculator 212. The elevation adjuster 216 is configured for adjusting an elevation of the parabolic reflector 22 relative to the sun according to the control signal from the solar location calculator 212. Efficiency of solar energy collection is thus improved.

It is to be understood that the described embodiments are intended to illustrate rather than limit the disclosure. Variations may be made without departing from the spirit of the disclosure as claimed. The above-described embodiment illustrates the scope of the disclosure but do not restrict the scope of the disclosure.

What is claimed is:

1. A solar energy collector, comprising:
   a parabolic reflector including a parabolic reflecting surface;
   a solar panel including a light receiving surface, the light receiving surface facing the reflecting surface of the parabolic reflector;
   a photosensor panel including a light sensing surface;
   a projecting pointer mounted on the photosensor panel;
   a solar location calculator connected to the photosensor panel, for calculating the trajectory of the sun relative to a geographic location of the parabolic reflector according to the motion of a shadow of the projecting pointer on the light sensing surface sensed by the photosensor panel and generating a control signal associated therewith;
   a reflector mount for supporting and moving the parabolic reflector in following movement of the sun in response to the control signal from the solar location calculator.

2. The solar energy collector as claimed in claim 1, wherein the reflector mount includes an azimuth adjuster communicatively coupled to the solar location calculator, the azimuth adjuster configured for adjusting an azimuth of the parabolic reflector according to the control signal from the solar location calculator.

3. The solar energy collector as claimed in claim 2, wherein the azimuth adjuster includes a rotary rod, a driven gear coupled to the rotary rod, a driving gear meshed with the driven gear, and a motor for driving the driving gear.

4. The solar energy collector as claimed in claim 3, wherein the reflector mount includes an elevation adjuster communicatively coupled to the solar location calculator, the elevation adjuster configured for adjusting an elevation of the parabolic reflector relative to the sun according to the control signal from the solar location calculator.

5. The solar energy collector as claimed in claim 4, wherein the elevation adjuster includes a power gear, a rotary gear meshed with the power gear, and a motor for driving the power gear, the rotary gear mounted on an opposite side of the parabolic reflector to the solar panel.

6. The solar energy collector as claimed in claim 5, wherein the rotary rod of the azimuth adjuster is coupled to the elevation adjuster.

7. The solar energy collector as claimed in claim 1, wherein the light receiving surface of the solar panel is perpendicular to a principal axis of the parabolic reflecting surface of the parabolic reflector.

8. The solar energy collector as claimed in claim 7, wherein the solar panel is positioned in the proximity of the focus point of the parabolic reflector.

9. The solar energy collector as claimed in claim 1, wherein the photosensor panel includes four reference lines on the light sensing surface for respectively aligning with due east, south, west and north.

10. The solar energy collector as claimed in claim 1, wherein the solar panel comprises an array of photovoltaic solar cells.

11. The solar energy collector as claimed in claim 10, wherein the photovoltaic solar cell is a PN or PIN junction type semiconductor element.

12. The solar energy collector as claimed in claim 10, wherein the semiconductor element comprises Ge, GaAs and GaInP.

13. The solar energy collector as claimed in claim 1, wherein the reflector mount includes an elevation adjuster communicatively coupled to the solar location calculator, the elevation adjuster configured for adjusting an elevation of the parabolic reflector relative to the sun according to the control signal from the solar location calculator.

14. The solar energy collector as claimed in claim 13, wherein the elevation adjuster includes a power gear, a rotary gear meshed with the power gear, and a motor for driving the power gear, the rotary gear mounted on an opposite side of the parabolic reflector to the solar panel.

* * * * *